(12) United States Patent
Mantel et al.

(10) Patent No.: US 8,598,466 B2
(45) Date of Patent: Dec. 3, 2013

(54) CONTROLLED-IMPEDANCE ELECTRONIC BOARD VIAS, METHOD OF FORMING THE SAME, AND UNITIZED PCB INCORPORATING THE SAME

(75) Inventors: Brian S. Mantel, Tigard, OR (US); David T. Engquist, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 356 days.

(21) Appl. No.: 13/016,744

(22) Filed: Jan. 28, 2011

(65) Prior Publication Data

US 2011/0240347 A1 Oct. 6, 2011

Related U.S. Application Data

(60) Provisional application No. 61/319,388, filed on Mar. 31, 2010.

(51) Int. Cl.
*H01K 3/10* (2006.01)
*H05K 1/03* (2006.01)

(52) U.S. Cl.
USPC .............................. 174/262; 174/255; 29/852

(58) Field of Classification Search
USPC .................. 174/262–266, 255; 361/792–795; 29/846–853
See application file for complete search history.

(56) References Cited

U.S. PATENT DOCUMENTS

| | | | | |
|---|---|---|---|---|
| 6,479,764 B1 * | 11/2002 | Frana et al. | .................... | 174/262 |
| 6,857,898 B2 | 2/2005 | Engquist et al. | | |
| 7,652,892 B2 * | 1/2010 | Shiu et al. | ..................... | 361/752 |
| 7,832,840 B2 | 11/2010 | Silverbrook et al. | | |
| 7,839,656 B2 | 11/2010 | Schack et al. | | |
| 7,843,056 B2 | 11/2010 | Smeys et al. | | |
| 2006/0044083 A1 * | 3/2006 | Kuzmenka | .................... | 333/246 |
| 2006/0131611 A1 * | 6/2006 | Kaluzni et al. | ................ | 257/206 |
| 2010/0307798 A1 | 12/2010 | Izadian | | |

* cited by examiner

*Primary Examiner* — Jeremy Norris
(74) *Attorney, Agent, or Firm* — James G. Stewart, PC; Marger Johnson & McCollom, P.C.; Thomas F. Lenihan

(57) ABSTRACT

A shielded signal pass-through or via structure integral with an electronic circuit board is described. The structure includes a rigid inner generally cylindrical conductor; at least a semi-rigid intermediate annular dielectric surrounding the conductor; and a rigid outer annular conductor surrounding the dielectric material. Also described is an interconnect device that presents a contact array in a boss region of a unitary embossed printed circuit board (PCB) optionally equipped with one or more such shielded vias.

11 Claims, 8 Drawing Sheets

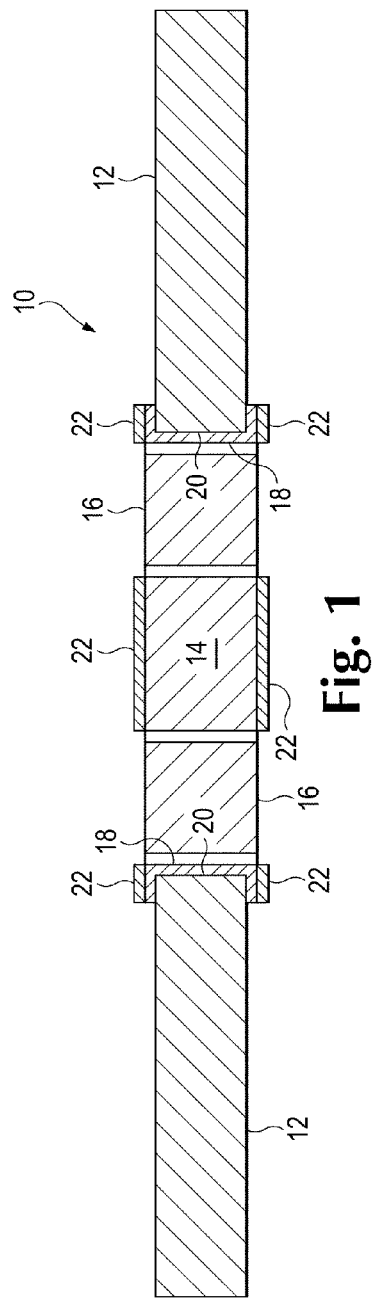
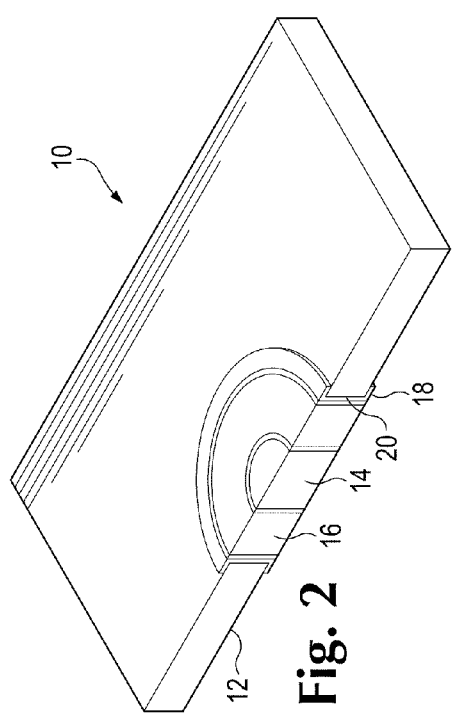

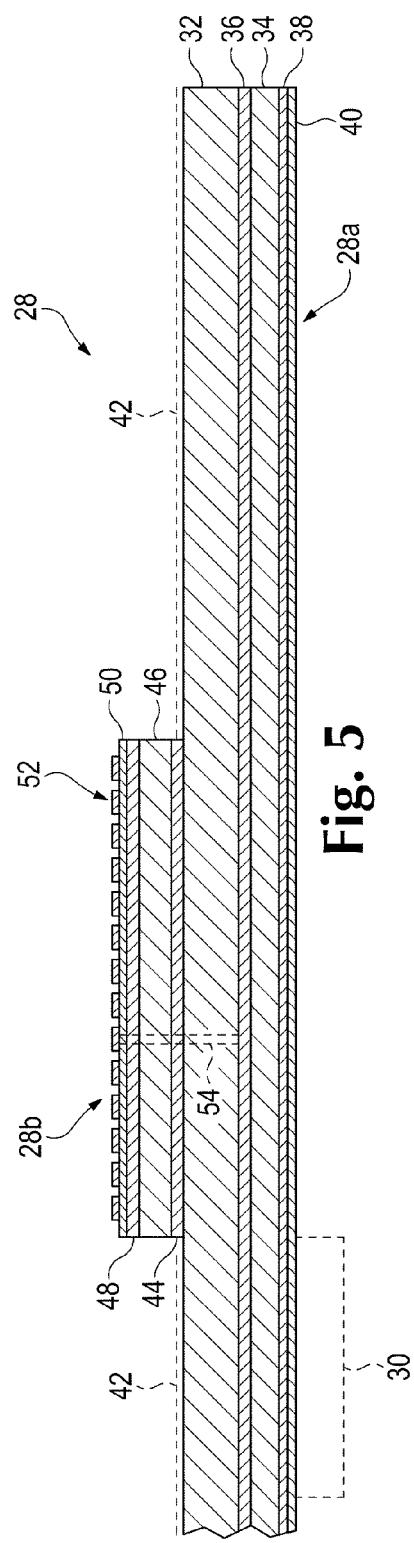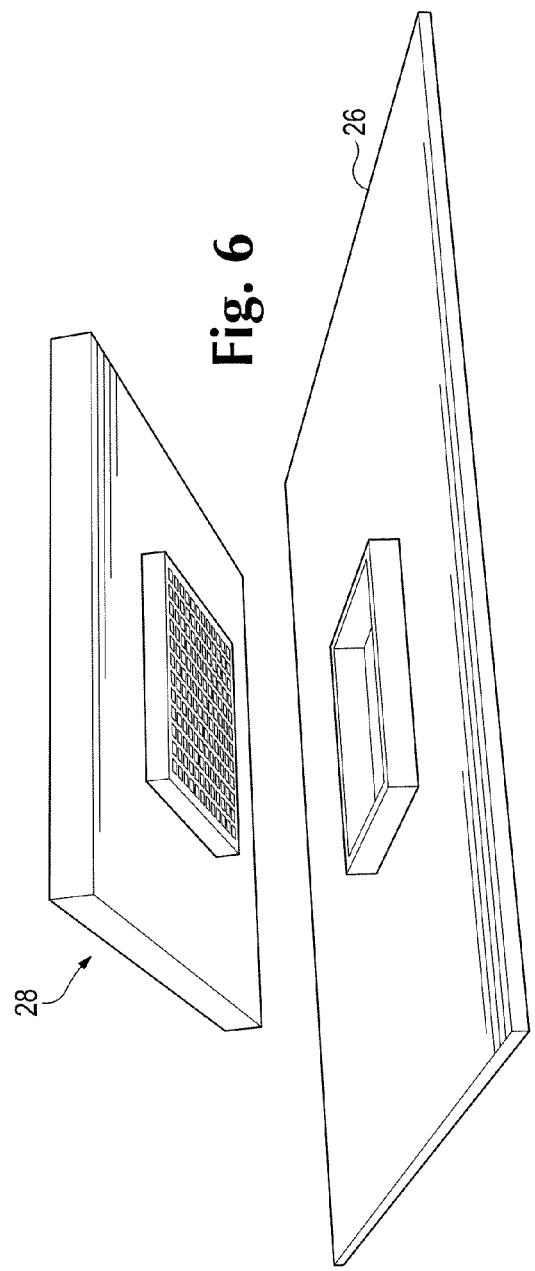

CONTROLLED-IMPEDANCE ELECTRONIC BOARD VIAS, METHOD OF FORMING THE SAME, AND UNITIZED PCB INCORPORATING THE SAME

RELATED APPLICATIONS

This application claims the benefit of priority to U.S. Provisional application No. 61/319,388 filed on Mar. 31, 2010 and entitled CONTROLLED IMPEDANCE SHIELDED PASS-THROUGH INTERCONNECT INTEGRATED INTO PCB MATERIAL, the contents of which are hereby incorporated herein in their entirety by this reference.

BACKGROUND OF THE INVENTION

Signal pass-through holes are annularly plated with a conductive material, e.g. copper, to form vias for connecting a first with another set of two identical signal net signatures in a printed circuit board (PCB). As PCB signal routing density increases, so does the spacing density of such vias. With increased density, the vias typically get smaller, which changes their electrical characteristics such as high- and low-frequency signal conductivity, impedance characteristics, etc. Some such vias form connections to signal grounding planes clad within one or more laminar PCB interior surfaces or one or more outer surfaces thereof, and provide for a common ground reference for plural separate signals conveyed by other vias also extending at least partway through the PCB.

Conventionally, an intermediate PCB is provided between a test board and an integrated circuit for temporarily mating the two. Most such intermediate PCBs require soldering of a multi-contact connector array to one or both sides of the intermediate PCB. Problems with such an intermediate PCB include the fact that a PCB's laminar structure including often large clad land areas representing signal routes and/or ground and/or power planes and/or the connector array itself tends to act as a heat-sink (characterized by having a relatively high thermal resistance) during the required soldering step. This either requires higher solder bath temperatures than are desired in manufacture or results in so-called cold solder joints or otherwise unreliable electrical mating characteristics in use. Indeed, the extra interconnect even if improbably but completely formed by soldering nevertheless adds a level of interconnection and thus reduces through-signal integrity and reliability.

Typically, so-called "pogo" pins, coil- and C-spring (or another form of leaf spring) probes, or other suitably compliant contacts are maintained in suitable compression (to ensure a reliable electrical/physical connection) between the via pads on the opposing surfaces of the intermediate PCB and the corresponding pads of the test board and processor mounted typically above and below the intermediate PCB. Exemplary ones of such pogo pins and spring probes are described in *High Performance Spring Probe Connector and Test Socket Solutions* at http://www.ardentconcepts.com/RC.html (2010) and in Land Grid Array Socket System at http://www.lgasockets.com/desc/defaultt.htm (2008). Familiarity by those of skill in the art with such prior art compliant contact systems is assumed.

In the very remotely related data/video transmission field, coaxial cables conventionally are used in long-distance, high-frequency signal conveyance applications such as video or other high-bandwidth data transmission between remote devices. Such cables typically include a flexible central conductor such as a copper wire, a flexible annular insulator, and a flexible annular outer shield including thin braided or woven conductors. Coaxial cables typically have threaded fasteners on either end for forming a suitably variable length connection between data communication equipment (DCE) and/or data terminal equipment (DTE), e.g. between a computer and a router, a digital video recorder (DVR) and a television (TV), a cable port and a cable modem, a video generator and a video monitor, etc.

Recently, coaxial cable launches have been designed for low-profile electronic circuit board mounting, with discrete solder connections at each coaxial wire-pair terminus. Such is described in U.S. Pat. No. 6,857,898 B2 entitled APPARATUS AND METHOD FOR LOW-PROFILE MOUNTING OF A MULTI-CONDUCTOR COAXIAL CABLE LAUNCH TO AN ELECTRONIC CIRCUIT BOARD, issued Feb. 22, 2005. This recent patent is commonly owned by the assignee of the present invention. The patent teaches the use of conventional flexible coaxial cable wires extending within a flexible ribbon cable featuring conventionally soldered connections for low-profile input/output (I/O) signal routing. The electronic circuit board is routed to thin its terminal edge, thereby creating a pocket or recess to receive the cable wires.

SUMMARY OF THE INVENTION

A signal pass-through structure integral with an electronic circuit board is described. The structure includes a rigid inner generally cylindrical conductor; at least a semi-rigid intermediate annular dielectric surrounding the conductor; and a rigid outer annular conductor surrounding the dielectric material, wherein the rigid inner conductor, intermediate dielectric, and outer conductor are configured to co-extend with one another through an electronic circuit board generally normal to a plane of the board from a first outer surface thereof to a second and opposite outer surface thereof.

Also described is a method of forming a shielded via in an electronic circuit board that includes providing a conductor clad core generally planar laminar structure sandwiched with one or more pre-preg layers having outer foil layer, the laminar structure forming a circuit board that features opposite outer surfaces; forming one or more holes through the laminar structure at defined locations, the holes extending generally normal therethrough between the opposite outer surfaces; plating the interior surfaces of the one or more holes with a conductive material configured as a rigid cylindrical annulus; forming a rigid solid cylindrical conductor within the interior of the cylindrical annulus; and forming an at least semi-rigid annular dielectric collar around the interior of the cylindrical conductive annulus, wherein the cylindrical annulus, the conductive annulus and the solid cylindrical conductor extend concentrically through the hole substantially to fill the hole, with the ends thereof being substantially planar and substantially co-planar with the opposite outer surfaces of the circuit board.

Finally, a laminar circuit interconnect device is described that includes a first laminar structure including an insulative fiber layer and at least one first conductive layer; a selectively patterned release layer overlying the first laminar structure; a second laminar structure including an insulative fiber layer and at least one second conductive layer, the second conductive layer including plural conductive pads located on an outer surface of the device to provide a circuit interconnect; the selectively patterned release layer extending substantially coextensive with the first laminar structure except in a bounded region thereof configured to define a contact array boss, the first laminar structure, the second laminar structure, and the release layer being stacked and adhered together into a parallel planar unitary structure, wherein a perimetric portion of the second laminar structure is configured to be routed and removed from the second laminar structure to leave a boss extending upwardly from the first laminar structure, the boss and the first laminar structure remaining adherently intact to form an embossed unitary interconnect device configured to interconnect with an external circuit via the plural conductive pads.

BRIEF DESCRIPTION OF THE DRAWINGS

FIG. 1 is a cutaway elevation showing a signal pass-through structure in the form of a shielded conductive via structure that provides an interconnect from one side of a printed circuit board (PCB) to another in accordance with a first embodiment of the invention taken along the lines 1,2-1,2 of FIG. 3.

FIG. 2 is a cutaway isometric view of the via taken along the lines 1,2-1,2 of FIG. 3.

FIG. 5 is a fragmentary cross-sectional elevation of a stacked unitary PCB including an interconnect boss region in accordance with a second embodiment of the invention in which one or more shielded vias in accordance with FIGS. 1-3 may be provided.

FIG. 6 is a perspective view of the unitary PCB of FIG. 5 in an imminent physical coupling arrangement with a device under test (DUT).

DETAILED DESCRIPTION OF THE DRAWINGS

The invention relates generally to so-called signal pass-through holes or vias for physically conveying electrical signals from one surface of an electronic circuit board to an opposite surface thereof. More particularly, the invention relates to vias that provide superior electrical impedance characteristics. The invention also relates to unitary, intermediate PCB structures that avoid soldering steps or the use of solder balls in reliably interconnecting a device under test (DUT) or outboard with an integrated circuit such as a processor or with a motherboard.

As used herein, the term "via" will be understood to broadly encompass signal conveyance holes formed through one or more layers of an electronic circuit board, whether they terminate on either outer clad surface of the PCB or internally on an intermediate clad inner surface thereof. Thus via broadly includes not only so-called "through" vias (passing all the way through the circuit board from one outer surface to the other) but also so-called "blind" vias (terminating on only one side of the circuit board) and so-called "buried" vias (terminating on neither side of the circuit board but instead being altogether internal thereto). Those of skill in the art will appreciate that all such via types are contemplated as being within the spirit and scope of the invention.

Those of skill will appreciate that one or more vias, as described and illustrated herein, can be formed in an electronic circuit board depending upon the desired application. Thus, while a typical application might have plural vias that are regularly (e.g. geometrically) arrayed, another application might have a single via, within the circuit board or an individual layer thereof.

Figure 3:
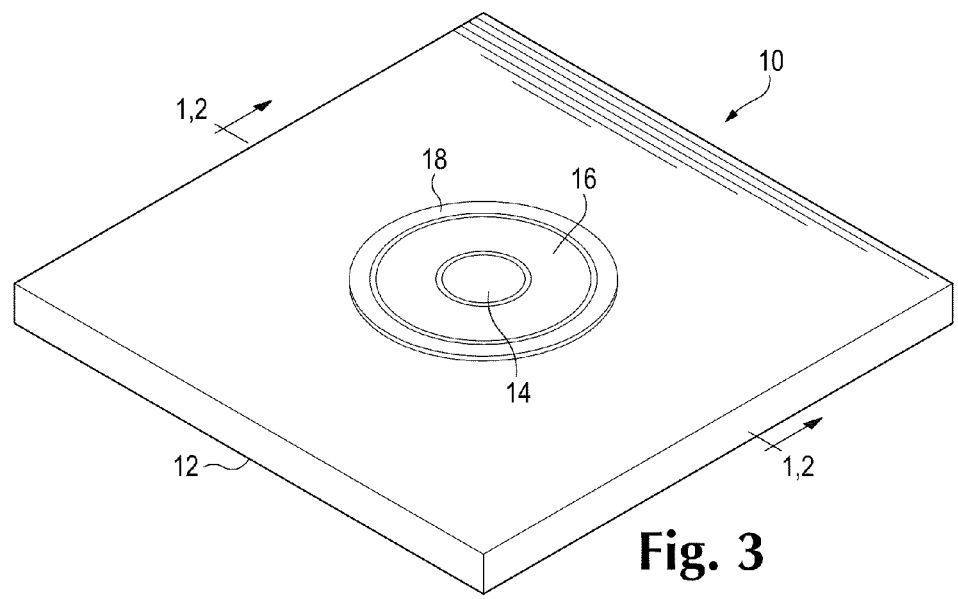
FIG. 3 is a fragmentary isometric view of the via of FIG. 1.

FIG. 1 is a fragmentary cutaway elevation taken along the lines 1, 2-1, 2 of FIG. 3. FIG. 1 shows a shielded signal pass-through structure or via 10 provided integrally within an electronic circuit board 12 in accordance with one embodiment of the invention. Those of skill in the art that electronic circuit board 12 can be provided within the spirit and scope of the invention with any desired number of such shielded via 10, with plural vias arrayed regularly or irregularly, as desired, across the surface of the electronic circuit board. FIG. 2 is a fragmentary cross-sectional isometric view of signal pass-through structure or via 10 taken along the lines 1,2-1,2 of FIG. 3. FIG. 3 is an isometric view of the via of FIG. 1.

Referring collectively now to FIGS. 1-3, shielded signal pass-through or via structure 10 includes a rigid inner generally cylindrical conductor 14, a semi-rigid or rigid annular dielectric spacer or collar 16 (referred to herein as being at least semi-rigid), and a rigid outer annular conductor 18 surrounding annular dielectric collar 16. As shown in FIG. 1, the rigid inner conductor, the annular dielectric collar, and the outer annular conductor are configured to co-extend with one another through the electronic circuit board generally normal to a plane of the electronic circuit board from a first outer surface thereof to an opposite outer surface thereof. Structure 10 will be understood to be formed within a through hole 20 (shown only in FIGS. 1 and 2 for the sake of clarity) that is formed in electronic circuit board 12.

Those of skill in the art will appreciate that cylindrical conductor 14 in accordance with one embodiment of the invention is substantially right cylindrical and substantially circular in cross section, as are the inner and outer features of dielectric spacer 16 and annular conductor 18. It is contemplated, however, that the inner and outer conductors and the dielectric spacer therebetween may be out-of-round in cross section, e.g. oval or any other suitable geometry, within the spirit and scope of the invention. They also may extend acutely/obtusely relative to the plane of the electronic circuit board, within the spirit and scope of the invention.

The inner cylindrical conductor, the annular dielectric spacer, and the outer annular conductor collectively provide a signal-conveyance structure including a signal conductance, e.g. via the inner conductor, and a return conductance path, e.g. via the outer conductor, with the signal conductance path and the return conductance path electrically isolated or insulated from one another by the dielectric spacer filling the annular gap therebetween. The shielded via thus extends transversely through the plane of the electronic circuit board for electrical interconnection between the signal and return conductance paths with one or more external circuits (not shown in FIG. 1 but shown in FIG. 6) on either outer surface of the electronic circuit board.

Those of skill in the art will appreciate that the slightest annular gaps shown in greatly scaled-up FIGS. 1-3 between inner conductor 14 and annular dielectric spacer 16, and between annular dielectric spacer 16 and outer annular conductor 18 are intended to clarify illustration of the shielded via structure 10 and its separate component parts as they fit within and extend through hole 20 prepared in electronic circuit board 12. In practice, such gaps are nominal or non-existent (in practice there might be microscopically visible micro- or nano-sized voids along the otherwise conforming, mating surfaces of the features).

Those of skill in the art will appreciate that inner and outer conductors 14 and 18 may be formed in any suitable way of any suitable material, within the spirit and scope of the invention. For example, one or both of the conductors may be made from a conductive earth metal including one or more precious metals chosen from a group consisting of silver, gold, cadmium, palladium, titanium, tin, or any other suitably high-conductivity metal. Alternative materials and methods of formation are contemplated as being within the spirit and scope of the invention. Those of skill in the art will appreciate that dielectric spacer 16 also may be formed in any suitable way of any suitable material. One workable manufacturing technique for the formation of a shielded signal pass-through structure integral with an electronic circuit board will be described below, but will be understood not to be limiting in any way or to be otherwise exclusive of any other suitable manufacturing technique.

The upper and lower surfaces of inner and outer conductors 14 and 18 can be selectively plated with any suitable conductive plating material indicated at 22 in FIG. 1 in cross-hatched lines. Those of skill in the art will appreciate that such plating of exposed surfaces can be done conventionally using conventional materials, e.g. tin, to improve circuit interconnect reliability against corrosion or oxidation of the precious metal contact's air-exposed surfaces. Such optional plating is contemplated as being within the spirit and scope of the invention. The plating of the otherwise exposed conductor surfaces on the outer surfaces of the electronic circuit board is electromechanically compatible with the use of compliant contact systems used for electronic interconnections with external devices.

Those of skill in the art will appreciate that the via structure described above and claimed herein can be manufactured in any suitable way. One such method of its manufacture is described as follows. An electrically conductive metal (e.g. copper) clad core layer having one or more pre-impregnated composite fiber (so-called 'pre-preg') layers each having an outer foil (e.g. copper) layer are prepared by conventional PCB manufacture techniques. The conductive metal clad core layer may be a thin copper foil patterned and etched to provide any signal routing that may be needed in a given electronic application. (Those of skill in the art will appreciate that each pre-preg layer with its outer foil layer provides another interconnect level within the electronic circuit board.) Typically, in the context contemplated hereby, the vias simply directly connect a signal from one surface of the PCB to another, and may be referred to as straight-through interconnections. The conductive metal cladding to the extent it is present may be of any suitable thickness and may be formed of copper or any other suitably electrically conductive metal, including amalgams or compositions thereof. The typically epoxy resin or fiberglass pre-preg layers will be referred to herein more generally as electrical insulators of insulative layers that provide electrical isolation or insulation between as between separate metal conductive layers bearing signal runs or so-called 'nets' in the circuit design's netlist.

The through holes or vias will be understood to be formed by an suitable technique including drilling or other selective removal process such as by the use of a numerically controlled mechanical drill bit or laser beam source of suitable energy level and focus. Such holes produced by laser drilling typically are referred to as micro-vias, as is known by those of skill in the art. De-smearing, e.g. plasma-etching, or otherwise cleaning of drilled holes produces a smooth and substantially particulate-uncontaminated (or so-called 'clean') and preferably burr-free (or so-called 'whisker-free') cylindrical sidewall suitable for plated connection with the conductive clad or foil layers therein to complete required signal connections in accordance with the circuit design's netlist.

Once clean and smooth holes have been prepared, the outer annular conductor may be plated in accordance with conventional plated-through hole (PTH) fabrication techniques. The annular conductor may be of any suitable thickness for current-carrying capacity and thus desired shielding as by connection to a ground or power-return grid or plane either in the laminar structure itself or formed as a part of the unitary PCB to be described below by reference to FIGS. 5 and 6.

Forming the central, solid, cylindrical conductor within the interior of the annular dielectric can be accomplished by any suitable technique including deposition, injection, or placement as follows: Substantially concentrically within the annular conductor, a fixture fixedly positions the inner cylindrical solid conductor. Such a fixture may be conventional, and it may take any suitable form, although one such form is illustrated herein in FIGS. 4A-4G. In accordance with one embodiment of the invention, such a fixture includes a solid conductor affixed thereto at a predefined locations representing the desired position of the solid conductor relative to a via having known X, Y, Z Cartesian coordinates. The solid conductor is positioned within the substantial center of the cylindrical via having the annular conductor already plated therewithin, the solid conductor's central axis being substantially aligned with the central axis of the via. While the solid conductor is so positioned relative to the via, the annular dielectric material is formed therearound and therein to secure the solid conductor within the substantial center of the via, as will now be described.

Forming the annular dielectric within the interior of the annular conductor can be accomplished as follows: After the solid conductor is positioned within the substantial center of the via, and in substantial axial alignment therewith, and while the fixture maintains the position and orientation of the solid conductor therein, fluid or semi-fluid (e.g. gel-like) dielectric material such as epoxy or another suitable material is formed in an annular cylindrical shape in the space between the solid conductor and the annular conductor. Then the formed dielectric material is dried or cured, as by a process involving a combination of chemical or temperature treatment (e.g. heating) and time passage, until the fluid dielectric material becomes sufficiently rigid or semi-rigid to capture the solid conductor in its fixture-enabled position and orientation.

After the dielectric annular material is sufficiently cured, the fixture is removed. This is because it is no longer required to fixedly position and orientate the solid conductor. Such can be done by simple removal of the fixture, as by physically separating it from the electronic circuit board (as suggested between FIGS. 4D and 4E discussed below) or by any other suitable mechanical process. The fixture may be reused or discarded. The shielded via remains in its proper position and orientation within the PCB in accordance with the X, Y, Z coordinates that were used to place it within the drilled or otherwise formed hole. Those of skill in the art will appreciate that one or more like shielded vias can be formed at once in desired locations across the plane of the PCB, using a fixture that is capable of temporarily positioning and orienting one or more of the solid conductors. Those of skill in the art will also appreciate that burs or sprues or other vestiges or artifacts of either the fixture or its use or its removal from the placed solid conductor can be removed by any suitable process such as grinding, milling, planing, or the like.

The result is a clean shielded via extending from one outer surface of an electronic circuit board to the other, the shielded via presenting smooth planar outer surfaces in the opposite planes of the respective outer surfaces of the circuit board.

Those of skill in the art will appreciate that the dimensions and tolerances of the outer annular conductor, the intermediate annular dielectric, and the inner solid conductor are application dependent. Such factors affecting this design trade-off include current-carrying capacity of a given signal and its return, signal frequency, whether or not the outer conductor is grounded, the dielectric constant (at operating temperature, pressure, and signaling frequency) of the dielectric material, and the desired impedance between the signal and return conductors. (Those of skill in the art will appreciate that, in general, the larger the distance between the center and outer conductors, the higher the impedance between, and thus the higher the noise immunity provided for, the signal and its return.) In accordance with one embodiment of the invention, some or all such factors are taken into account in determining the absolute and relative dimensions of the inner conductor, the intermediate annular dielectric, and the outer annular conductor. In accordance with one illustrated embodiment of the invention detailed in FIGS. 1-3, the surface areas of the inner solid conductor and the outer cylindrical conductor are on the same order of magnitude while the surface area of the intermediate annular dielectric is an order of magnitude greater.

Within the spirit and scope of the invention, any suitable ratios among the diameters, surface areas, and/or volumes of the three features are contemplated. Also within the spirit and scope of the invention, dimensional tolerances are a matter of design choice and performance criteria, as well as the cost and calibration and quality control of the prepared feature elements and any fixture used to place them, as will be understood by those of skill in the art.

Those of skill in the art will appreciate that, within the spirit and scope of the invention, outer surfaces of the shielded via can be plated, as needed (whether to improve conductivity, connective reliability or durability, corrosion resistance, or any other needed improvement). The surface plating process may be conventional. Plating materials may include materials any suitable conductive metals such as the rare earth or other metals or amalgams thereof. For example, the plating material may be selected from a group consisting of silver, gold, cadmium, palladium, titanium, and tin, and may include compositions and/or combinations thereof with one another and/ or other conductive metals. Of course, any suitable alternative plating material may be used, as any and all are contemplated as being within the spirit and scope of the invention.

FIGS. 4A-4G are believed to be largely self-explanatory from the description above. FIGS. 4A-4G illustrate various stages in the use of an alignment fixture 24 in accordance with one embodiment of the invention to manufacture a single shielded via. Those of skill in the art will appreciate that fixture 24 and its use is readily modified for use in manufacturing one or more electronic circuit boards each including plural ones of such shielded vias 10.

Figure 4A:
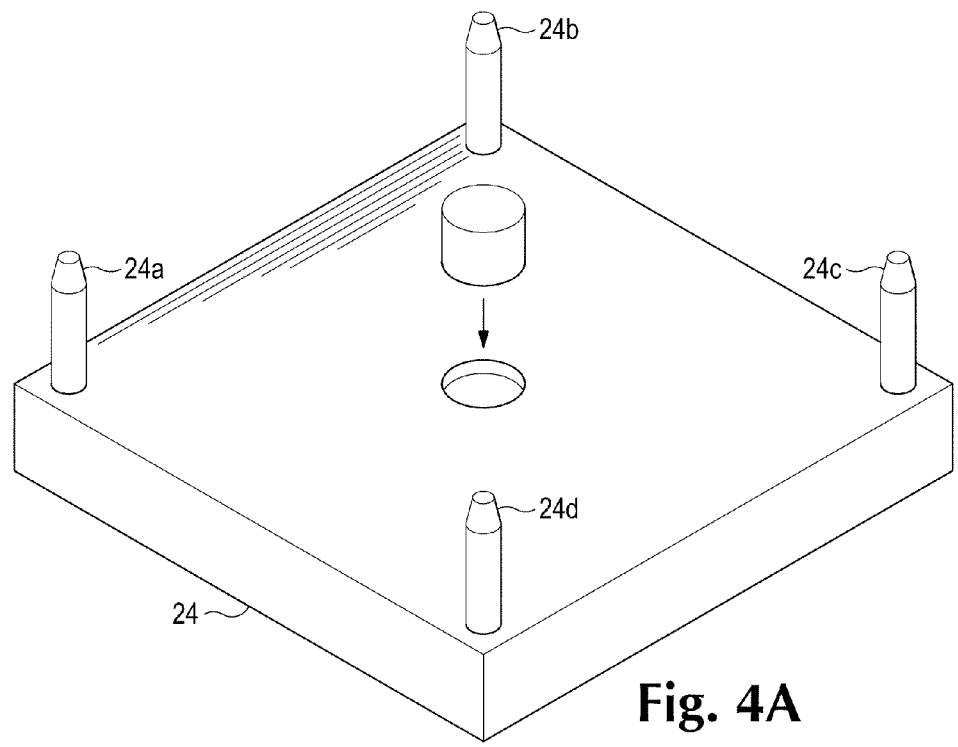
FIGS. 4A-4G are perspective views illustrating a method of manufacturing the shielded via of FIGS. 1-3.
Figure 4B:
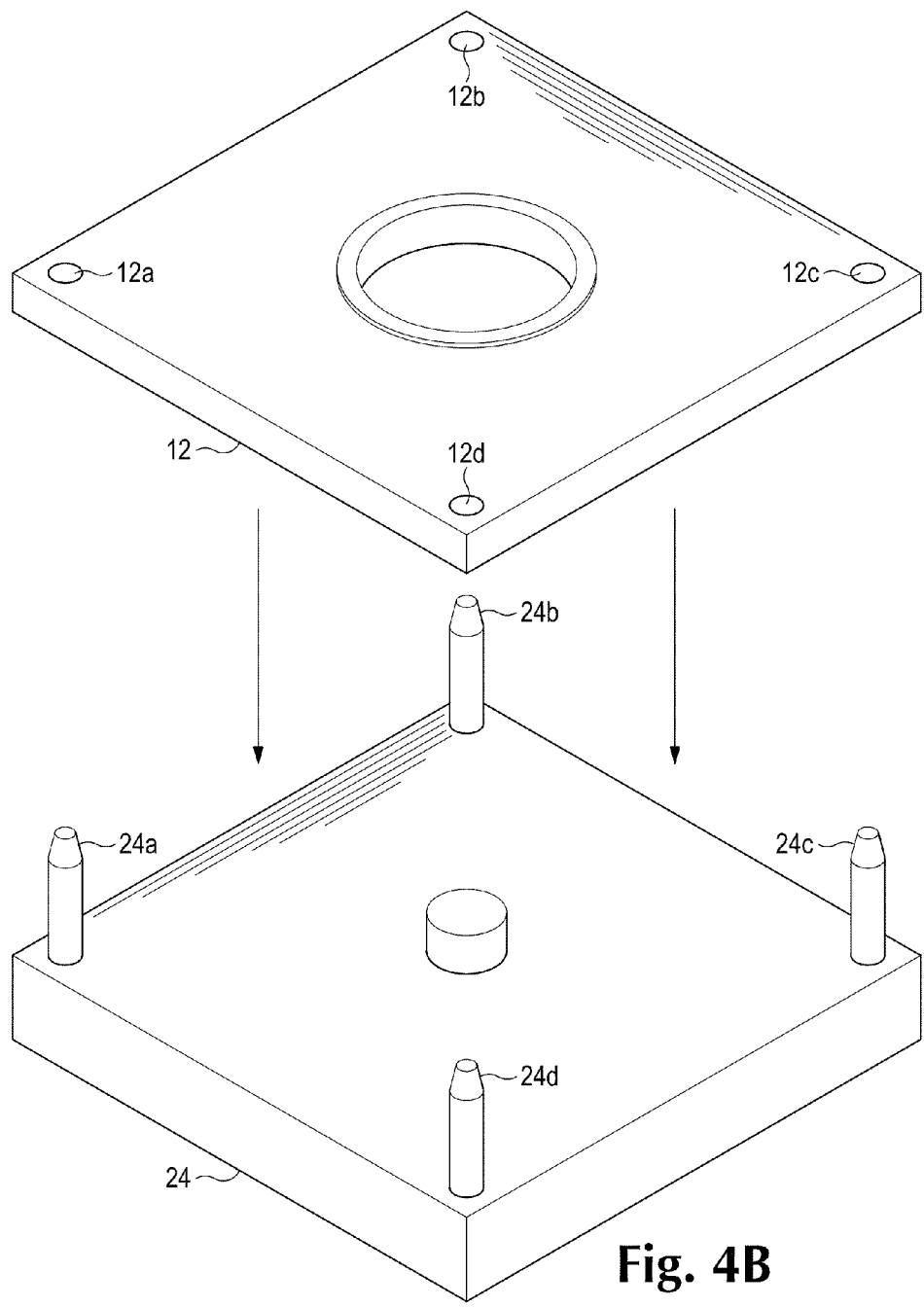
Figure 4C:
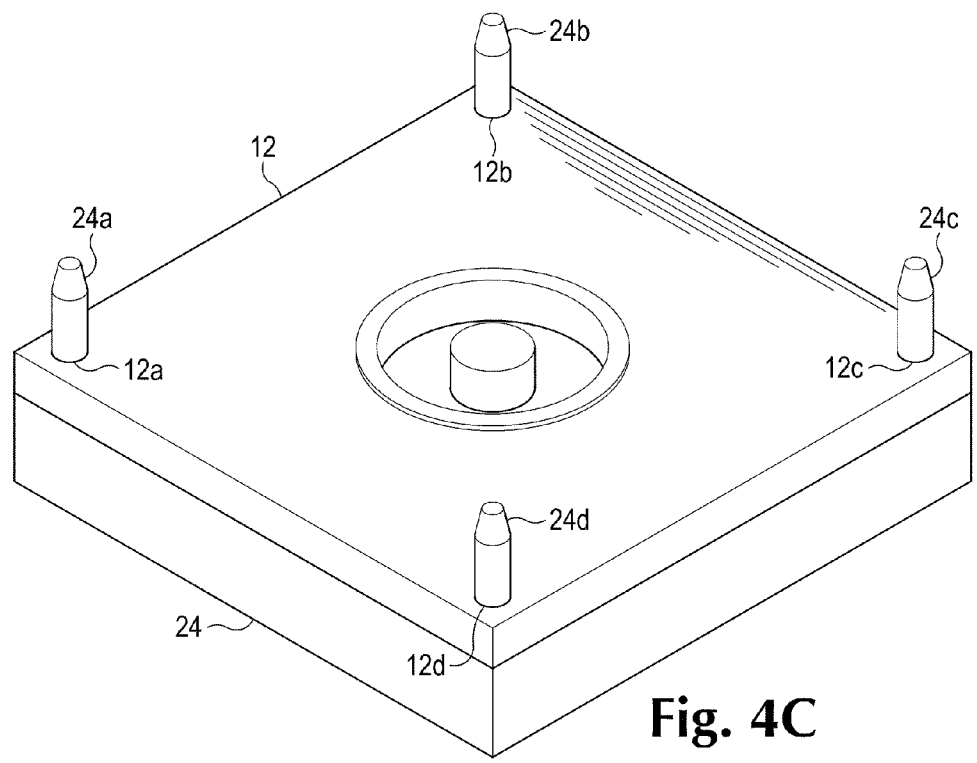
Figure 4D:
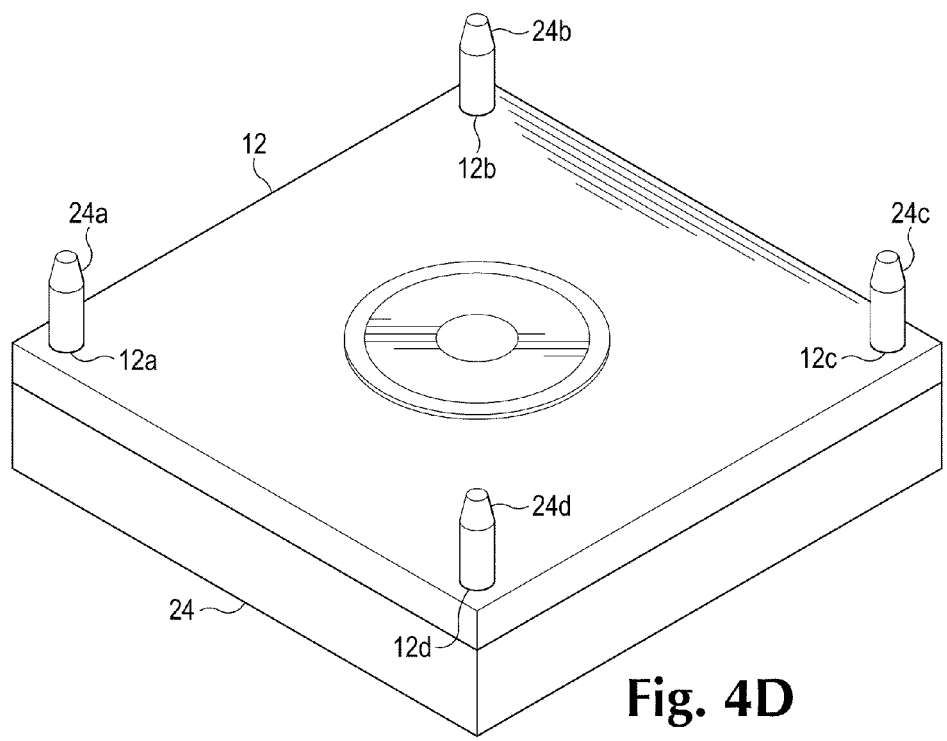
Figure 4E:
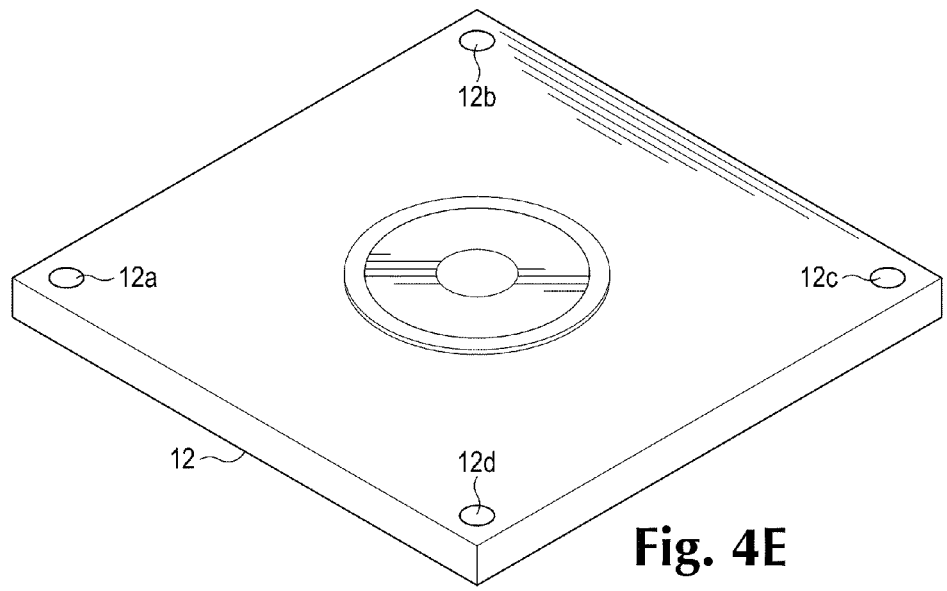
Figure 4F:
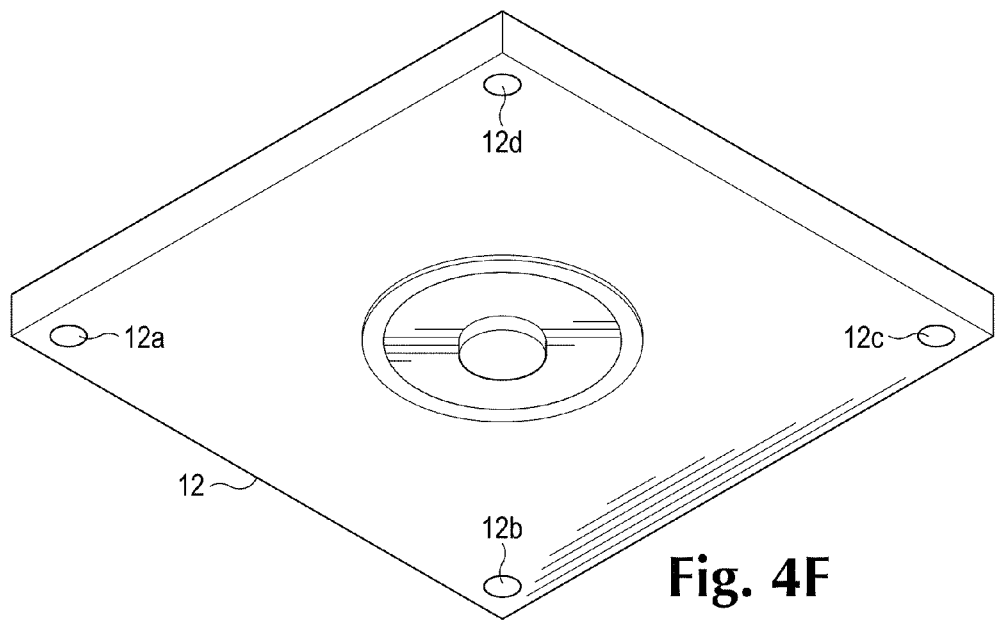
Figure 4G:
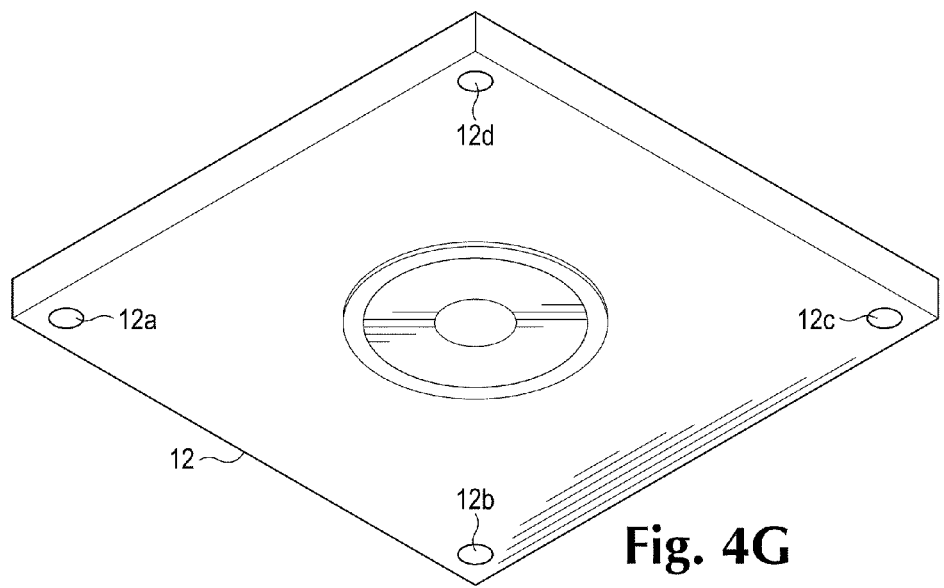

FIG. 4A shows a slug of (center) cylindrical conductor material being positioned within a fitting cylindrical recess formed within an alignment fixture 24 having plural, e.g. four perimetrically arranged, e.g. corner, alignment pins 24a, 24b, 24c, 24d. FIG. 4B shows an electronic circuit board 12 with a PTH to act as a shield and with four alignment holes 12a, 12b, 12c, and 12d provided therein corresponding with the respective four alignment pins 24a, 24b, 24c, and 24d extending outwardly from fixture 24. FIG. 4C shows the cylindrical conductor slug aligned by the fixture to the central axis of the PTH. FIG. 4D shows a curable liquid with an appropriate dielectric constant filling the annular gap between the cylindrical conductor and the PTH's annular conductor. FIG. 4E shows that, once the dielectric material hardens to a semi-rigid or rigid state, the annular dielectric holds the cylindrical conductor in place and the electronic circuit board can be removed from the fixture. FIG. 4F shows that a portion of the cylindrical conductive slug that was being held in place by the fixture extends from the lower surface of the electronic circuit board and requires trimming and/or planing FIG. 4G shows the planed surface of the shielded via substantially co-planar and flush with the lower planar surface of the electronic circuit board and ready for interconnection with other devices. Those of skill in the art will appreciate that the upper surface of the shielded via may also be planed to planarize and smooth its outer interconnect pad surface. Those of skill also will appreciate that an optional selective plating step may be performed to protect the planar center conductor surfaces from abrasion, corrosion, oxidization, or other undesirable conditions, or otherwise to provide better interconnect performance, reliability, durability, etc.

Those of skill will appreciate that alignment fixture 24 may take alternative forms, within the spirit and scope of the invention, as may the fixturing process itself. Indeed, any suitable method of forming one or more shielded vias 10 integrally within an electronic circuit board 12 is contemplated as being within the spirit and scope of the invention.

Those of skill also will appreciate that the electronic circuit board including one or more shielded vias made in accordance with the invention may be raw board tested for proper interconnectivity, i.e. ideally zero or very low impedance where continuity is desired (as among electrically connected or common signal nets and/or endpoints or termini) and very high or ideally infinite impedance where no continuity is desired (as among electrically disconnected or separate signal nets and/or termini). Such is typically done with a testing apparatus and control program that sequences through a stored netlist for the electronic circuit board and exercises (e.g. with so-called 'walking 0s' and 'walking 1s') the signal nets described by the netlist (to ensure continuity and to avoid cross-talk and/or or noise susceptibility).

FIGS. 5 and 6 collectively show a second aspect of the invention featuring a unitized printed circuit board (PCB) featuring a boss or embossed region for mating with an external socket or interconnect device such as a device under test (DUT) 26. FIG. 5 is a fragmentary front elevation illustrating the stack-up or layup of the unitized electronic circuit board component parts, and FIG. 6 is a perspective view of the unitized PCB in use.

Unitized PCB 28 may be seen to have disposed in a first surface region thereof a board structure 28a including one or more first layers of conductor clad core material (typically double-sided copper cladding) and one or more layers of pre-preg material each having a copper foil layer thereon. Board structure 28a may be referred to herein as a first laminar structure.

Those of skill in the art will appreciate that board structure 28a may include as many layers as needed by a given application, with conventional PTHs provided where needed for circuit and layer interconnects among layers and to the outer surfaces thereof. Board structure 28a may also include one or more integrated circuits 30 mounted thereon, as indicated by dashed lines in FIG. 5. In other words, stacked board structure 28a may be thought of as a conventional PCB, so far as it has been described to this point.

Uniquely, unitized PCB 28 also may be seen to have disposed in a second and opposite surface region thereof a board structure 28b provided with one or more shielded pass-through structures or vias 10. Unitized PCB 28 thus is described herein as being embossed because the second surface region is an adhered boss that extends partway across unitized PCB 28 matingly adhered thereto and in parallel planar alignment with the first surface region. It will be seen that the boss provides for a more reliable and direct and solderless connection between a test pattern-producing or exercise circuit and DUT 26. Thus, board structure 28b may be thought of as an integrated riser board for providing direct, solderless connections with test sockets or other external interconnect devices. Because it optionally features one or more shielded vias or pass-through structures also taught herein, its performance and reliability of unitized PCB 28 is further enhanced. Board structure 28b may be referred to herein as a second laminar structure.

Those of skill in the art will appreciate that one or more shielded vias 10 may extend also partway or all the way through otherwise-conventional board structure 28a. The shielded vias 10 may be formed using known Every Layer InterConnect (ELIC) techniques that are known to those of skill in the art to enable the manufacture of mult-layer electronic circuit boards containing blind or hidden vias. This will be understood to require a precise alignment of adjacent layers and their contained vias, since the board structure 28a may of course be multi-layer. In other words, shielded vias 10 may be provided in PCB 28 in accordance with the invention along with conventional PTHs. Thus, the added advantage of controlled impedance in the routing of one or more signals from within board structure 28a through board structure 28b to the external contact pad thereon for direct interconnection with a device under test (DUT) 26 is made possible.

FIG. 5 shows PCB 28 as described above to include board structure 28a and boss board structure 28b. Board structure 28a in accordance with one embodiment of the invention includes upper and lower copper or other conductive-metal clad cores 32, 34 with an adherent insulative (e.g. pre-preg or other suitable material) layer 36 sandwiched therebetween. Beneath lower copper clad core 34 is another pre-preg layer 38 having a conductive-metal (e.g. copper or other suitable material) foil layer 40 disposed thereon. (Those of skill in the art will appreciate that, within the spirit and scope of the invention, one or more such conductor clad layers sandwiched with a pre-preg layer having a foil layer disposed thereon are contemplated, thereby to accommodate uni-layer or multi-layer PCBs of any desired complexity.)

Sandwiched and adhered between board structure 28a and board structure 28b is a selectively patterned release layer 42 (e.g. of a material such as KAPTON® film or any suitable alternative, shown in dashed lines in FIG. 5 because it has already been selectively routed and removed from the perimeter around board structure 28a) that extends across the surface of board structure 28a everywhere but where the targeted boss of board structure 28b is to be located. Those of skill in the art will appreciate that this patterned release layer permits a perimetric portion of board structure 28b to be routed and released to configure the remnant board structure 28b as a male boss that provides a direct signal array interconnect to an external device such as a conforming female receptacle such as a socket. FIG. 5 includes an arrow pointing out the routing perimeter for the controlled Z-depth cut to be described.

Board structure 28b may be seen to include a pre-preg layer 44 adhering to mating board structure 28a in the region thereof where the release layer is omitted. Thus it is straightforward to perform a controlled-depth so-called Z axis routing around the perimeter of board structure 28b to form the illustrated boss region of unitized PCB 28. Those of skill in the art will thus appreciate that board structure 28a and board structure 28b are initially coextensive with one another until the perimeter of board structure 28b is removed by routing. The routing produces the embossed PCB structure shown in FIGS. 5 and 6. Those of skill in the art will appreciate that the perimeter routing is contiguous around the targeted boss of unitized PCB 28, and is performed in such manner that the surrounding cut extends depth-wise in a controlled manner through all layers of board structure 28b (and optionally through release layer 42) but not through any layers of board structure 28a.

Referring still to FIG. 5, above pre-preg layer 44 is disposed a copper clad core layer 46 and another pre-preg layer 48. Those of skill in the art will appreciate that above pre-preg layer 48 a foil layer 50 and a contact pad array 52 are disposed. Typically disposed within boss board structure 28b and also typically disposed partway within board structure 28a are one or more signal pass-through structures 54 that correspond with the pads of contact pad array 50 (as shown in dashed lines extending through board structure 28b and partway through 28a). Those of skill in the art will appreciate that one or more of such signal pass-through structures 54 may take the form of invented shielded vias 10, as described and illustrated herein, that extend through board structure 28b and that may also extend at least partway through board structure 28a.

Those of skill in the art will appreciate that FIG. 6 illustrates the use of unitized PCB 28 in a test apparatus or other interconnect application, with its array of pads representing shielded vias 10 on board structure 28b positioned to imminently mate a socket interconnect of an external DUT 26. Not shown in FIG. 6 for the sake of clarity are compliant contact systems that ensure spring-loaded firm and accurate contact between the pad array contacts and the socket interconnect contacts. The use of such compliant contact systems as are described in the Background section is contemplated in accordance with one embodiment of the invention.

Myriad alternative uses may be made of unitized PCB 28, as will be appreciated. For example, solder bumps or balls may be formed on the contact pads for direct and semi-permanent instead of temporary mating with external interconnect devices. These and other alternative uses of unitized PCB 28 are contemplated as being within the scope of the invention.

It will be appreciated that, within the spirit and scope of the invention, shielded vias 10 are useful within or outside the context of unitized PCB 28.

It will also be appreciated that unitized PCB 28, within the spirit and scope of the invention, may include only conventional PTHs rather than the invented shielded vias, or may contain both types of signal pass-through structures.

It is believed however that the combination is uniquely useful and advantageous in producing higher performance and more reliable signal interconnects with external devices.

It will be understood that the present invention is not limited to the method or detail of construction, fabrication, material, application or use described and illustrated herein. Indeed, any suitable variation of fabrication, use, or application is contemplated as an alternative embodiment, and thus is within the spirit and scope of the invention.

It is further intended that any other embodiments of the present invention that result from any changes in application or method of use or operation, configuration, method of manufacture, shape, size, or material, which are not specified within the detailed written description or illustrations contained herein yet would be understood by one skilled in the art, are within the scope of the present invention.

Accordingly, while the present invention has been shown and described with reference to the foregoing embodiments of the invented apparatus, it will be apparent to those skilled in the art that other changes in form and detail may be made therein without departing from the spirit and scope of the invention as defined in the appended claims.

We claim:

1. A laminar circuit interconnect device comprising:
    a first laminar structure including an insulative fiber layer and at least one first conductive layer, a selectively patterned release layer overlying the first laminar structure; and a second laminar structure including an insulative fiber layer and at least one second conductive layer, the second conductive layer including plural conductive pads located on an outer surface of the device to provide a circuit interconnect;

the selectively patterned release layer extending substantially coextensive with the first laminar structure except in a bounded region thereof configured to define a contact array boss, the first laminar structure, the second laminar structure, and the release layer being stacked and adhered together into a parallel planar unitary structure, wherein a perimetric portion of the second laminar structure is configured to be routed and removed from the second laminar structure to leave a boss extending upwardly from the first laminar structure, the boss and the first laminar structure remaining adherently intact to form an embossed unitary interconnect device configured to interconnect with an external circuit via the plural conductive pads.

2. The interconnect device of claim 1 further comprising:
one or more vias extending at least partway through the device from the plural conductive pads substantially normal to a plane of the first and second laminar structures.

3. The interconnect device of claim 2, wherein at least one of the one or more vias includes a cylindrical center conductor surrounded by an annular dielectric surrounded by an annular conductor.

4. The interconnect device of claim 3, wherein the at least one via extends through the second laminar structure and at least partway through the first laminar structure.

5. The interconnect device of claim 4, wherein the first laminar structure includes plural first conductive layers, and wherein the annular conductor is connected to a ground plane formed in at least one of the plural first conductive layers.

6. The interconnect device of claim 1, wherein the boss is configured to mate an external device under test, and wherein the at least one first conductive layer is configured to mount an integrated circuit.

7. A method of forming a shielded via in an electronic circuit board, the method comprising:

providing a generally planar laminar electronic circuit board structure including one or more insulative layers and one or more outer conductive foil layers, the laminar structure including opposite outer surfaces;

forming a through hole in the laminar structure at a defined location, the hole extending generally normal to a plane of the laminar structure between the opposite outer surfaces;

plating the interior surfaces of the hole with a conductive material configured as a rigid cylindrical conductive annulus;

forming a rigid solid cylindrical conductor within the interior of the insulative collar, and forming an at least semi-rigid annular dielectric collar around the interior of the cylindrical conductive annulus, including providing a fixture that positionally and orientationally aligns the formed cylindrical conductor relative to the conductive annulus while the forming of the dielectric collar is performed, the dielectric collar, the conductive annulus, and the solid cylindrical conductor extending concentrically through the hole substantially to fill the hole, with the ends thereof being substantially planar and substantially co-planar with the opposite outer surfaces of the electronic circuit board.

8. The method of claim 7, wherein the forming of the cylindrical conductor is performed before the forming of the dielectric collar is performed.

9. A method of forming a shielded via in an electronic circuit board, the method comprising:

providing a generally planar laminar electronic circuit board structure including one or more insulative layers and one or more outer conductive foil layers, the laminar structure including opposite outer surfaces;

forming a through hole in the laminar structure at a defined location, the hole extending generally normal to a plane of the laminar structure between the opposite outer surfaces;

plating the interior surfaces of the hole with a conductive material configured as a rigid cylindrical conductive annulus;

forming a rigid solid cylindrical conductor within the interior of the insulative collar, and forming an at least semi-rigid annular dielectric collar around the interior of the cylindrical conductive annulus, the dielectric collar, the conductive annulus, and the solid cylindrical conductor extending concentrically through the hole substantially to fill the hole, with the ends thereof being substantially planar and substantially co-planar with the opposite outer surfaces of the electronic circuit board;

wherein the forming of the cylindrical conductor within the interior of the cylindrical conductive annulus includes placing a prepared cylindrical conductor within the interior of the conductive annulus utilizing an external fixture mounted positionally and orientationally relative to the electronic circuit board, the fixture configured to fix the position and orientation of the cylindrical conductor therein while the forming of the dielectric collar is performed, and wherein the forming of the dielectric collar includes introducing a defined quantity of dielectric material into the annular gap between the cylindrical conductor and the conductive annulus, and wherein the fixture is further configured to be removed after the forming of the dielectric collar is completed.

10. A method of forming a shielded via in an electronic circuit board, the method comprising:

providing a generally planar laminar electronic circuit board structure including one or more insulative layers and one or more outer conductive foil layers, the laminar structure including opposite outer surfaces;

forming a through hole in the laminar structure at a defined location, the hole extending generally normal to a plane of the laminar structure between the opposite outer surfaces;

plating the interior surfaces of the hole with a conductive material configured as a rigid cylindrical conductive annulus;

forming a rigid solid cylindrical conductor within the interior of the insulative collar, and forming an at least semi-rigid annular dielectric collar around the interior of the cylindrical conductive annulus, the dielectric collar, the conductive annulus, and the solid cylindrical conductor extending concentrically through the hole substantially to fill the hole, with the ends thereof being substantially planar and substantially coplanar with the opposite outer surfaces of the electronic circuit board; and planing one or more of the outer surfaces of the shielded via to smoothly align with a planar outer surface of the electronic circuit board.

11. The method of claim 10 further comprising:

selectively plating the one or more planarized outer surfaces of the shielded via.

* * * * *